United States Patent [19]

Kuhn et al.

[11] 3,942,102

[45] Mar. 2, 1976

[54] SPARK IGNITED COMBUSTION ENGINE ANALYZER

[75] Inventors: Klaus Roland Kuhn; Viktor Stigler, both of Karlsruhe, Germany

[73] Assignee: Siemens Aktiengesellschaft, Munich, Germany

[22] Filed: May 21, 1974

[21] Appl. No.: 471,906

[30] Foreign Application Priority Data

May 25, 1973 Germany ............................ 2326839

[52] U.S. Cl. ............................................ 324/16 R

[51] Int. Cl.[2] ............................................ G01R 13/42

[58] Field of Search ............................ 324/16 R, 15

[56] References Cited

UNITED STATES PATENTS

| | | | |
|---|---|---|---|
| 3,603,872 | 9/1971 | Pelta | 324/16 R |
| 3,714,554 | 1/1973 | Benedix | 324/16 R |
| 3,768,004 | 10/1973 | Abnett et al. | 324/16 R |
| 3,771,047 | 11/1973 | Spengler et al. | 324/16 R |
| 3,793,584 | 2/1974 | Liebermann et al. | 324/16 R |

*Primary Examiner*—Stanley T. Krawczewicz
*Attorney, Agent, or Firm*—Kenyon & Kenyon Reilly Carr & Chapin

[57] ABSTRACT

An engine analyzer for examining the firing voltage curves of spark plugs in internal combustion engines in which two leads are taken from a tap on the high voltage side of the ignition coil with one lead provided to an amplitude discriminator for checking the trailing edge of the portion of the voltage curve referred to as the starting voltage line and the second to an amplitude discriminator for examining what is referred to as the combustion voltage line, with the discriminator outputs provided to a logic circuit which by properly combining the two discriminator outputs gives an indication of proper or improper firing and the type of malfunction present when improper firing occurs.

7 Claims, 7 Drawing Figures

SPARK IGNITED COMBUSTION ENGINE ANALYZER

BACKGROUND OF THE INVENTION

This invention relates to engine analyzers in general and more particularly to an improved analyzer for analyzing the firing voltage curve of a spark plug in an internal combustion engine.

It is well recognized that internal combustion engines operated by spark plugs which are externally fired can suffer from various types of misfiring caused by spark plug defects. It is known that the type of defect can be recognized by an examaination of the firing voltage curves. Typically, the voltage curves are examined at the high voltage side of the ignition coil. Common causes of misfiring are those caused by lead coated or fouled spark plugs, by cracks in the plug insulator or by flash overs in the spark plug connection. In general then, two basic types of defects can be detected, one caused by fouling and the other caused by flash over either because of a crack in the insulation or some other reason. A determination of these misfiring and their type can be accomplished by wave-shape analysis using an oscilloscope. Typical of such instruments is that described in German Auslegschrift 1,288,853. However, the use of this type apparatus presupposes heavy practical experience in order that a correct diagnosis be made from the path of the curve. Furthermore, interpretation of the oscilloscope pattern is made more difficult if misfirings occur only intermittently. This is particularly true if for multi-cylinder engines where the intermittent error curve must be selected from among a plurality of proper firing curves, each of which differs from one another.

A type of automatic detection equipment is disclosed in German Augslegsschrift 2,040,913. This device provides for automatic detection of the wave-shape of the firing voltages in a multi-cylinder external combustion engine without the need for an oscilloscope. In the device described therein, a plurality of measuring channels are provided which scan the firing voltage curves in consecutive time periods under control of a control unit with time slots assigned to the individual channel for storing the scanned values. A corrolator is then used to insure that the firing voltage curves are assigned to corresponding cylinders of the engine.

Clearly, it can be seen that these devices of the prior art suffer from serious disadvantages; the oscilloscope requires well trained operators and has the difficulty of detecting intermittent faults and the above described automatic type device is quite complex. Thus, there is a need for an improved device of this nature which is simple to operate and not prohibitively expensive to build.

SUMMARY OF THE INVENTION

The present invention provides such a device. In simple terms, the analyzer of the present invention detects voltage values of the firing voltage curve using individual discriminators and makes a logical decision depending on the magnitude of the measured values as to whether trouble-free ignition has occured or one of the more common firing defects has caused misfiring to have taken place. Briefly, two discriminators are used, both having their inputs coupled on the high voltage side of the ignition coil. One is used to detect the falling edge of the portion of the voltage curve referred to as the starting voltage line and the other to detect the portion of the voltage curve referred to as the burning voltage line. The trailing edge of the starting voltage line will be a fairly sharply decreasing slope under normal operating conditions or in the case of a flash over. The combustion voltage line during normal operation will be of a somewhat constant magnitude. In the case of flash-over, however, this constant magnitude will not be present. In the case of fouled plugs, the sharp drop-off of the starting voltage line does not occur. Thus, by detecting these two conditions, and logically combining them, it is possible to determine whether or not perfect ignition has taken place and if not, whether the defect is the result of a fouled plug or a flash-over condition.

DETAILED DESCRIPTION OF THE PREFERRED EMBODIMENT

Figure 1:
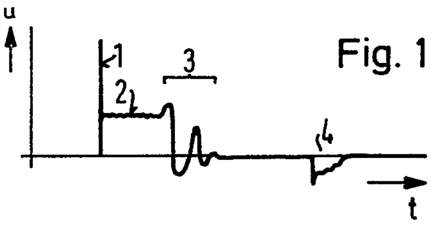
FIG. 1 is a voltage wave-form illustrating the voltage at the high voltage side of the ignition for normal ignition.
Figure 2:
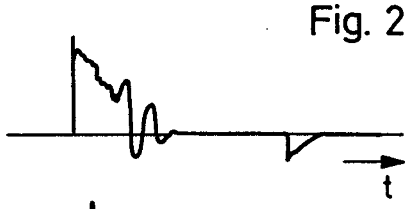
FIG. 2 is a similar diagram illustrating the type of voltage curve obtained when a fouled spark plug is present.
Figure 3:
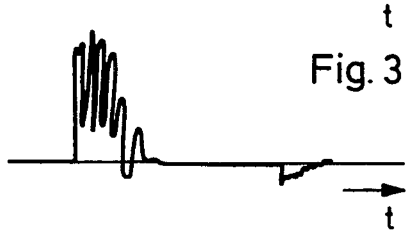
FIG. 3 is a similar diagram illustrating operation with flash-over.
Figure 4:
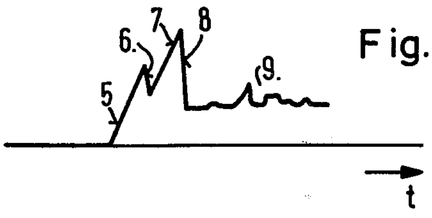
FIG. 4 is the wave-form of FIG. 1 on an expanded time scale.
Figure 5:
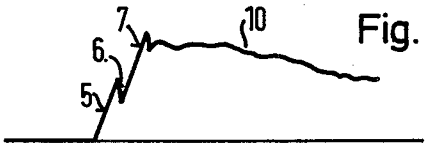
FIG. 5 is the wave-form of FIG. 2 on a similarly expanded time scale.

FIG. 1 illustrates the voltage curve which occurs during normal ignition. As illustrated, there are four identifiable portions of the curve. The reference numeral 1 indicates the portion of the curve which is referred to as the starting voltage or starting voltage line. The essentially horizontal portion 2 is referred to as the combustion voltage line. The third portion represents a decaying process upon completion of burning and the portion 4 a change caused by the closing operation of the breaker points. The wave-form of FIG. 1 is shown on an expanded time scale on FIG. 4. From FIG. 4 it is seen that the starting voltage is not a spike as shown on FIG. 1 but comprises a number of segments. Starting from zero, it contains an almost linear segment 5 followed by a short dip 6 caused by the spark gap breakdown in the distributor. The dip 6 is then followed by a further almost linear rise 7 until the beginning of the breakdown between the electrodes of the spark plug. This breakdown results in a sharply falling voltage as shown as the segment 8 on FIG. 4. The voltage falls to the level of the burning voltage designated by 9 on the figure. FIGS. 2 and 5 are similar illustrations of the voltage curve for a lead coated or fouled spark plug. The rising portions 5, 6 and 7 of the starting voltage line are the same as that described above in connection with FIGS. 1 and 4. However, after rising to its peak, a sharp breakdown does not occur. Because of the fouling, the voltage breaks down more slowly with the fouling material acting as a shunt resistance. This type of breakdown is illustrated by the portion of the curve 10 of FIG. 5. As can be seen in FIG. 2, the remainder of the curve i.e., the oscillation 3 and the negative spike 4 is the same as that of FIG. 1.

Figure 6:
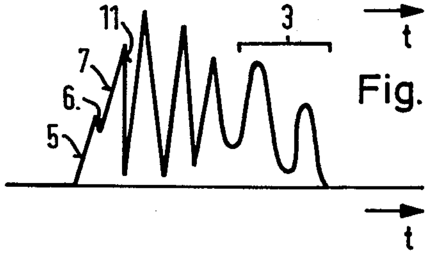
FIG. 6 is the waveform of FIG. 3 also on an expanded time scale.

FIG. 6 illustrates the firing voltage curve which results from a flash-over outside the combustion chamber, i.e., a flash-over from the ignition wire or through the insulation of the spark plug. Again, the initial build-up as designated by the portions 5, 6 and 7 of the curve is the same. However, at a certain point, flash-over occurs with the voltage dropping rapidly as designated by the portion of the curve 11. This takes place outside the internal combustion engine and no burning line is established. Rather, the voltage again rises and flashes over again. This occurs several times until the oscillations of the decaying process indicated as 3 occur.

Analysis of these figures shows that for normal firing, a sharp voltage decline followed by a horizontal combustion line 9 will be present. With lead coated or fouled spark plugs, the voltage decline is absent. Instead, the voltage falls slowly as shown by the segment 10 of FIG. 5. If an external flashover or breakdown occurs, a sharp decline similar to the decline 8 is present indicated by the falling portion 11 of the wave-form of FIG. 6 but no essentially constant value burning line is established.

Figure 7:
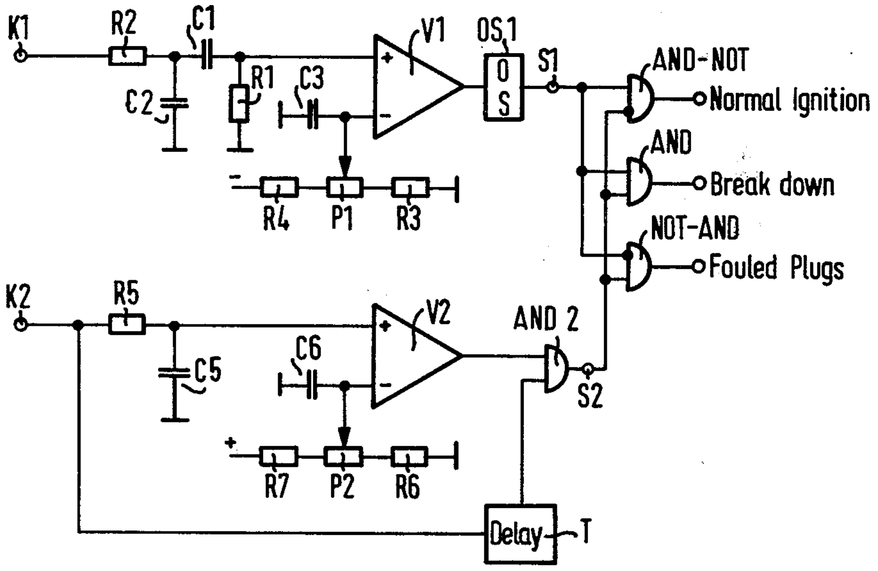
FIG. 7 is a schematic-logic diagram of the analyzer apparatus of the present invention.

The present invention makes use of these characteristics to provide a relatively simple analyzer which will indicate the occurance of either normal ignition or misfiring due to fouled or lead coated spark plugs or due to an external flash-over. It does this by detecting the two above mentioned conditions, i.e., the sharp decline and the constant or horizontal combustion voltage. If both these conditions are present then normal ignition has occured. If the sharp decline is present, but not the constant combustion voltage, then a flash-over has occured. If a somewhat constant voltage is determined without the sharp decline, then fouled or lead coated spark plugs are present. Thus, as illustrated by FIG. 7, two amplitude discriminators are provided, one for detecting the sharp decline 8 and the other for detecting the horizontal portion 9. These comprise respectively the differential amplifiers V1 and V2 and their associated circuits. The outputs of these are then combined in three gates to provide indications of the three possible conditions corresponding to FIGS. 4, 5 and 6. The outputs of these gates are presented in a yes-no type indication and require no interpretation by the operator.

Two input terminals designated K1 and K2 are provided which are connected to a tap at the high voltage side of the ignition coil. The voltage is provided through a low pass filter comprising resistor R2 and capacitor C2 and then through a differentiator comprising capacitor C1 and resistor R1. The differentiator output is provided to the non-inverting input of differential amplifier V1. In this configuration, amplifier V1 without any feedback acts as a comparator with the voltage being provided to the non-inverting input compared with a reference voltage at the inverting input. This reference voltage is provided by a voltage divider made up of two fixed resistors R3 and R4 in series with a variable resistor P1, the fixed resistors R3 and R4 being on each side of the variable resistor or potentiometer P1. Negative voltage is applied to resistor R4 and resistor R3 is grounded. This permits presetting a voltage at the inverting input of the amplifier V1 which if exceeded by the voltage at the non-inverting input will cause a change in an output at the terminal S1. Note that what is being detected is the slope 8 or 11 of FIG. 4 or 6 respectively. By differentiating the input voltage, the change of voltage dv/dt is being provided as the input to the amplifier V1. In the case of a properly declining waveform, a value of dv/dt which is negative and of a proper magnitude will result. When the negative voltage so obtained exceeds the negative voltage at the inverting input the output of amplifier V1 will switch over from being positive to being negative. A capacitor C3 is also provided as an AC ground for the inverting input of amplifier V1. The output of amplifier V1 is an input to a one shot OS1 adapted to fire in response to a negative going pulse. Thus, upon detection of a slope such as slope 8 or 11, one shot OS1 will fire and have an output pulse which is at a positive voltage level.

The input on the terminal K2 is provided through an integrator comprising resistor R5 and capacitor C5 to ground to the non-inverting input of differential amplifier V2. Its inverting input is similarly biased by a resistor divider combination made up of fixed resistors R7 and R6 in series with a potentiometer P2 with a positive voltage applied to resistor R7 and R6 grounded. Again, an AC ground through capacitor C6 is provided. With a zero voltage at the non-inverting input, the positive voltage at the inverting input will result in a negative output from the amplifier V2. Only if a positive voltage is provided at the non-inverting input which exceeds the positive reference value provided to the inverting input will the output of amplifier V2 become positive. The output of amplifier V2 is provided as one input to an AND gate designated AND 2. The second input to AND gate 2 is the input voltage from terminal K2 delayed through a delay circuit designated T. The gates herein are of the type wherein a positive voltage represents a logical "1" and a negative voltage a logical "0". Thus, AND gate AND 2 will have an output at terminal S2 which is positive or a logic "1" when both inputs are positive. The terminal S1 is provided as an non-inverted input to an AND gate designated AND NOT, as a non-inverted input to an AND gate designated AND and as an inverted input (as indicated in conventional fashion by the dot) to an AND gate designated NOT AND. The output at terminal S2 is provided as an inverted input to the gate AND NOT and as a non-inverted input to the gate AND and AND NOT.

Operation of the circuit will now be explained. Proper design of the low pass filter made up of resistor R2 and capacitor C2 along with the differentiator made up of capacitor C1 and resistor R1 will result in an input to the non-inverting input of amplifier V1 which depends on the rate of decline of the trailing edge 8 of the starting voltage line. That is, it will provide an input proportional to dv/dt. For a sharp decline such as that occuring under the conditions of FIGS. 4 or 6, a large value will be provided as an input but for a condition such as that shown on FIG. 5, dv/dt will be small. As a result, under conditions of normal ignition or of an external flash-over the negative voltage at the non-inverting input to V1 will exceed the negative voltage at the reference input at the inverting input and the output at S1 will go negative firing one shot OS1 and causing it to have a positive or logical "1" output. For the condition shown by FIG. 5, the value at the non-inverting input of V1 will not exceed the value at the inverting input and the amplifier output will remain positive and one shot OS1 will not fire remaining at a logical "0". Proper setting of the potentiometer P1 will ensure that as sharp a voltage decline as must be detected is set in to the first discriminator, i.e., the differential amplifier V1 and its associated circuitry. Proper setting of the potentiometer also permits distinguishing between the normal decline after formation at the spark plug designated by 8 and short reignition such as that indicated along the combustion line 9 of FIG. 4 which occurs when ignition has already commenced but is then interrupted by the gas stream and reignited. The length of the output pulse from OS1 is set to exceed the delay caused by delay element T.

In the second discriminator made up of the differential amplifier V2 and its associated circuitry, in the integrator made up of resistor 5 and capacitor C5, during a perfect ignition a slow linear rise of the voltage across capacitor C5 occurs and appears at the non-inverting input of amplifier V2, after a sharp rise due to the starting voltage. If misfiring due to lead coated plugs or fouling occurs a higher input is present and a sharper voltage increase occurs. Similarly, in the case of spark plug breakdown, in which case the high peaks result in a greater average voltage, a similar sharp rise occurs. As a result, during normal ignition, a rise in voltage of one magnitude will occur and during a misfiring due to either fouled spark plugs or external breakdowns a voltage rise of greater magnitude will occur. Thus, at the end of a fixed time, a greater voltage will be present if misfiring has occured than if normal firing has occured. Potentiometer P2 is set so that it provides, as a reference, a value greater than that which will occur during normal firing but less than that which will occur for misfiring at the end of the delay time built into the time delay element T. Delay element T will provide an enabling signal to AND gate AND 2 a predetermined time after detecting ignition. Thus, if normal firing has occured at the time when the delay element T enables AND gate 2 the voltage at the inverting input will still be greater than the voltage at the non-inverting input and a negative output or logical "0" will be provided to the second input of AND gate 2 causing it to similarly have an output which is a logical "0". On the other hand, if either type of misfiring has occured, the voltage at the non-inverting input will exceed that at the inverting input and a positive or logical "1" output will result causing gate AND 2 to also have a logical "1" output. The outputs present at the terminals S1 and S2 are summarized as follows:

| | | |
|---|---|---|
| S1 = 1 | S2 = 0 | normal ignition |
| S1 = 1 | S2 = 1 | no ignition, due to external voltage breakdown |
| S1 = 0 | S2 = 2 | spark plugs lead-coated or fouled |

The length of the pulse from OS1 insures that the noted condition corresponding to S1 which occurs at portion 8 or 11 of the waveform is still present when the second condition corresponding to S2 is detected later on. As a result, during the first condition for normal ignition gate AND NOT will have a "1" input from S1 and a "0" input from S2. This latter input is inverted and thus, gate AND NOT will provide an output at a logical "1" indicating normal ignition. With both S1 and S2 logical "1"s gate AND will provide a logical "1" output to indicate an external breakdown. And in the third case with S1 a logical "0" and S2 a logical "1", gate NOT AND will provide an output indicating fouled plugs. These outputs may then be provided to appropriate storage and indicating devices to provide a visual yes-no indication of sprk plug operation. This will indicate both whether operation is normal and if not normal, whether the malfunction is due to an external breakdown, i.e., due to a breakdown in the plug socket or the like or, is due to fouled or lead coated spark plugs.

Thus, an improved engine analyzer for analyzing spark plug firing curves has been shown. Although a specific embodiment has been illustrated and described, it will be obvious to those skilled in the art that various modifications may be made without departing from the spirit of the invention which is intended to be limited solely by the appended claims.

We claim:

1. An analyzer for the firing voltage curve in an internal combustion engine having a spark plug ignition system including an ignition coil with a tap on its high voltage side comprising:

a. a first means having a first input terminal for coupling to the tap on the high voltage side of the ignition coil for detecting the trailing edge of the starting voltage line having a slope greater than a first predetermined value and providing an output indicative thereof;

b. second means having a second input terminal for coupling to said high voltage tap for detecting a burning voltage whose average value is less then a second predetermined value and providing an output indicative thereof; and c. logic means having as inputs the output of said first and second means for decoding said output to provide a final output indicating the type of ignition occurring.

2. An analyzer according to clain 1 wherein said first means comprise:

a. means for generating an output proportional to said first predetermined value;

b. a first differential amplifier having the output of said means for generating coupled to one input terminal; and c. a differentiator coupling the output of said first input terminal to the other input of said differential amplifier.

3. An analyzer according to claim 2 and further including a low-pass filter between said coil and said differentiator.

4. An analyzer according to claim 1 wherein said second means for detecting comprises:

a. a second differential amplifier having a reference voltage proportional to said second predetermined value coupled to one terminal; and b. an integrator having its input coupled to the output of said ignition coil and providing its output to the other input of said differential amplifier;

c. delay means having the output of said ignition coil as an input; and d. a first AND gate having as inputs the outputs of said differential amplifier and the output of said delay circuit.

5. An analyzer according to claim 3 wherein said second means for detecting comprises:

a. a second differential amplifier having a reference voltage proportional to said second predetermined value coupled to one terminal; and b. an integrator having its input coupled to the output of said ignition coil and providing its output to the other input of said differential amplifier;

c. delay means having the output of said ignition coil as an input; and d. a first AND gate having as inputs the outputs of said differential amplifier and the output of said delay circuit.

6. An analyzer according to claim 5 wherein said logic means comprise:

a. a second AND gate having a non-inverted input coupled to said first amplifier and an inverted input coupled to said first AND gate;

b. a third AND gate having two non-inverted inputs coupled to said first amplifier and said first AND gate, and;

c. a fourth AND gate having an inverted input coupled to said first amplifier and a non-inverted input coupled to said first AND gate.

7. An analyzer according to claim 6 wherein said second, third and fourth AND gates are coupled to said first amplifier through a one shot.

* * * * *